(12) United States Patent
Pesika et al.

(10) Patent No.: US 10,259,975 B2
(45) Date of Patent: Apr. 16, 2019

(54) USE OF SHEAR TO INCORPORATE TILT INTO THE MICROSTRUCTURE OF REVERSIBLE GECKO-INSPIRED ADHESIVES

(71) Applicant: The Administrators of the Tulane Educational Fund, New Orleans, LA (US)

(72) Inventors: Noshir Pesika, River Ridge, LA (US); Kejia Jin, River Ridge, LA (US)

(73) Assignee: The Administrators of the Tulane Educational Fund, New Orleans, LA (US)

(*) Notice: Subject to any disclaimer, the term of this patent is extended or adjusted under 35 U.S.C. 154(b) by 0 days.

(21) Appl. No.: 15/366,444

(22) Filed: Dec. 1, 2016

(65) Prior Publication Data

US 2017/0137673 A1    May 18, 2017

Related U.S. Application Data

(62) Division of application No. 14/373,278, filed as application No. PCT/US2013/022469 on Jan. 22, 2013, now Pat. No. 9,546,308.

(60) Provisional application No. 61/588,471, filed on Jan. 19, 2012.

(51) Int. Cl.
```
C09J 9/00      (2006.01)
C09J 7/00      (2018.01)
C09J 183/04    (2006.01)
B82Y 30/00     (2011.01)
B81C 1/00      (2006.01)
C09J 175/04    (2006.01)
F16B 5/07      (2006.01)
F16B 11/00     (2006.01)
```

(52) U.S. Cl.
CPC ............. C09J 9/00 (2013.01); B81C 1/00103 (2013.01); B82Y 30/00 (2013.01); C09J 7/00 (2013.01); C09J 175/04 (2013.01); C09J 183/04 (2013.01); B81B 2203/0361 (2013.01); B81B 2207/053 (2013.01); C09J 2201/626 (2013.01); F16B 5/07 (2013.01); F16B 11/006 (2013.01); Y10T 428/24479 (2015.01)

(58) Field of Classification Search
CPC ........................................................ B32B 3/10
USPC ........................................................... 428/56
See application file for complete search history.

(56) References Cited

FOREIGN PATENT DOCUMENTS

WO    WO 03095190 A1 * 11/2003    ......... A44B 18/0003

* cited by examiner

Primary Examiner — Brent T O'Hern
(74) Attorney, Agent, or Firm — Emily L. Gordy; Carver, Darden, Koretzky, Tessier, Finn, Blossman & Areaux, LLC

(57) ABSTRACT

The present invention relates to an easy, scalable method, relying on conventional and unconventional techniques, to incorporate tilt in the fabrication of synthetic polymer-based dry adhesives mimicking the gecko adhesive system. These dry, reversible adhesives demonstrate anisotropic adhesion properties, providing strong adhesion and friction forces when actuated in the gripping direction and an initial repulsive normal force and negligible friction when actuated in the releasing direction.

10 Claims, 18 Drawing Sheets

FIGURE 9

| Sample | θ | θ$_s$ |
|--------|---|-------|
| 1 | 90° | 70°(±1) |
| 2 | 80°(±1) | 43°(±2) |
| 3 | 70°(±2) | 29°(±2) |
| 4 | 60°(±3) | 12°(±4) |

USE OF SHEAR TO INCORPORATE TILT INTO THE MICROSTRUCTURE OF REVERSIBLE GECKO-INSPIRED ADHESIVES

COPENDING APPLICATIONS

This application claims priority benefit of U.S. Provisional Application No. 61/588,471 filed Jan. 19, 2012 and PCT Application No. PCT/US 13/22469 filed on Jan. 22, 2013. This application is also a divisional of U.S. Non-Provisional application Ser. No. 14/373,278 filed on Jul. 18, 2014 and issued as U.S. Pat. No. 9,546,308. Said aforementioned applications are incorporated herein by reference as if set forth in full below.

BACKGROUND OF THE INVENTION

I. Field of the Invention

The present invention relates to novel reversible gecko-inspired adhesives, and a method of producing novel reversible gecko-inspired adhesives using shear to incorporate tilt into the microstructure of novel reversible gecko-inspired adhesives.

II. General Background

The superior adhesive properties of geckos, which allow them to repeatedly attach strongly and detach easily from a variety of surfaces, have inspired the fabrication of synthetic dry adhesives. However, an adhesive material that exhibits all the characteristics of gecko adhesion still remains elusive. The superior adhesive properties of geckos are attributed to the complex, hierarchical topography of fine tilted and curved columnar structures (setae) each bearing multiple trapezoidal-shaped terminal pads (spatulae) that make up the adhesive arrays on gecko toes. Natural gecko setal arrays show strong adhesion and friction forces originating from van der Waals interactions when sheared in the "gripping direction" towards the axis of tilt, but show no adhesion and smaller friction when sheared in the opposite "releasing direction." This mechanically-controllable adhesion anisotropy allows for easy and rapid locomotion on vertical and inverted surfaces.

Synthetic adhesives based on a variety of materials and fabrication schemes have been developed to mimic gecko adhesion, yet a true mimic still remains elusive because of limitations in current nanofabrication techniques. The Dhinojwala group used chemical vapor deposition to create gecko-inspired adhesive tape based on high-density carbon nanotubes. The Sitti group fabricated by soft lithography approaches slanted polyurethane-based microstructures that showed anisotropic adhesion. The del Campo group used a combination of multi-step photolithography and soft lithography to generate hierarchical structures. Jeong et al. fabricated micro/nanoscale hierarchical polymeric hairs using a two-step UV-assisted capillary molding technique. The Cutkosky group used microfabrication techniques to develop single level wedge-shaped dry adhesives with anisotropic properties, and the Israelachvili group used photolithography and molding techniques to create microflaps composed of polydimethylsiloxane, which also showed anisotropic tribological properties.

Although anisotropic soft polymer structures (elastic modulus E~0.1-1 MPa) had been fabricated previously, in 2008, the Fearing group was the first to fabricate anisotropic gecko-inspired dry adhesives from a hard polymer, polypropylene (E~1.4 GPa). The Turner group reported that improved adhesion could be obtained with the integration of nano and microstructures due to enhanced structural compliance, and the Bhushan group provided a theoretical analysis on a multi-level hierarchical structure showing adhesion enhancement to rough surfaces.

While a major focus in fabricating gecko-like adhesives has been on the geometrical design of the structures, recent work has shown that chemistry—i.e., surface functionality and presence of lipids—should also be considered in their future designs. The above synthetic dry adhesives either do not show anisotropic adhesion or rely on multi-step, expensive fabrication schemes, which are not easily scalable for hierarchical structures. There is thus a need for an easy, scalable fabrication scheme for dry, reversible adhesives that exhibit anisotropic adhesion. The present invention can be shown to have numerous advantages over conventional adhesives such as tapes that rely on tacky filaments and over other synthetic dry adhesives.

While certain novel features of this invention shown and described below are pointed out in the claims, the invention is not intended to be limited to the details specified, since a person of ordinary skill in the relevant art will understand that various omissions, modifications, substitutions and changes in the forms and details of the invention illustrated and in its operation may be made without departing in any way from the spirit of the present invention.

SUMMARY OF THE PRESENT INVENTION

An aspect of the present invention includes a method of fabricating an adhesive which comprises the steps of fabricating a patterned mold, applying a first polymer to said patterned mold, allowing said first polymer to partially cure, removing said partially-cured first polymer from said patterned mold, applying a predetermined lateral shear distance to said partially-cured first polymer, allowing said sheared partially-cured first polymer to fully cure, applying a second polymer to said sheared fully-cured first polymer, allowing said second polymer to fully cure, and removing said second fully-cured polymer from said sheared first polymer.

A further aspect of the present invention includes a method of fabricating an adhesive which comprises the steps of fabricating a patterned mold, applying a first polymer to said patterned mold, allowing said first polymer to fully cure, removing said fully-cured first polymer from said patterned mold, applying a second polymer to said fully-cured first polymer, allowing said second polymer to fully cure, and removing said second fully-cured polymer from said first polymer.

A still further aspect of the present invention includes an adhesive comprising a base, a plurality of pillars, where each respective pillar of said plurality of pillars comprises a first end and a second end, wherein said first end of each respective pillar is attached to said base, and a plurality of pad-like structures, wherein each pad-like structure of said plurality of pad-like structures is attached to said second end of at least one of said plurality of pillars.

A still further aspect of the present invention includes a method for fabricating an adhesive comprising a step for forming a patterned mold, a step for forming an inverse replica of said patterned mold, a step for shearing said inverse replica of said patterned mold and a step for forming a final adhesive using said sehared inverse replica of said patterned mold.

A still further aspect of the present invention includes a device for adhering comprising a means for supporting a plurality of adhesive assemblies, and a means for gripping a surface when shearing forces are applied in a first direction and for releasing said surface when shearing forces are applied in a second direction, wherein said gripping means are attached to said supporting means.

A still further aspect of the present invention includes a base, a pillar having a first end and a second end, wherein said first end is attached to said base, and a pad-like structure, wherein said pad-like structure is attached to said second end.

The above and other objects and features of the present invention will become apparent from the drawings, the description given herein, and the appended claims.

BRIEF DESCRIPTION OF THE DRAWINGS

For a further understanding of the nature and objects of the present invention, reference should be had to the following descriptions taken in conjunction with the accompanying drawings in which like parts are given like reference numerals.

FIG. 9 shows the initial (or as fabricated) tilt angle $\theta$ of the pillars compared to their static tilt angles $\theta_s$ during shearing in the gripping direction.

DETAILED DESCRIPTION OF THE PREFERRED EMBODIMENT

Detailed descriptions of one or more preferred embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in any appropriate manner.

Figure 1:
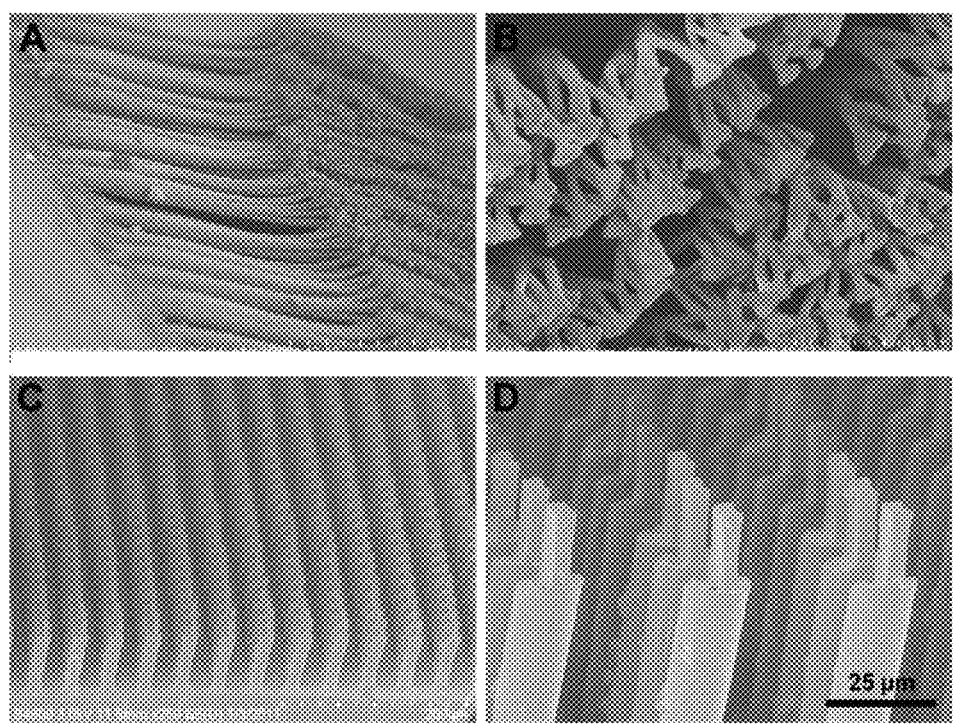
FIG. 1 shows SEM images of (A) the side view of a Tokay gecko setal array, (B) a magnified view of the spatula pads, (C) a gecko-inspired adhesive of the present invention, and (D) a magnified view of the pad-like structures of a gecko-inspired adhesive of the present invention.

A combination of microfabrication and molding techniques is used to fabricate 2-level polyurethane (PU) hierarchical structures (FIGS. 1C and 1D), which mimic the setal shaft and the spatula pad of geckos (FIGS. 1A and 1B). Adhesion and friction forces are measured, using a universal materials tester, along the tilt direction ("gripping" direction) and against the tilt direction ("releasing" direction). The gecko-inspired adhesives show anisotropic adhesion and friction generating strong adhesion and friction when sheared (or actuated) in the gripping direction and initial repulsive normal forces and weak friction when sheared in the releasing direction. The magnitude of the adhesion force is also consistent with a nanoscale tape-peeling model (the Peel zone model); the adhesion force increases as the tilt angle decreases.

EXAMPLE 1

Fabrication of Patterned Silicon Mold

Silicon master wafers were fabricated using standard microfabrication techniques. Briefly, four-inch silicon wafers (Test grade, University Wafers) were cleaned in an oxygen plasma, after which a 600 nm oxide layer was grown using plasma-enhanced chemical vapor deposition. Next, positive photoresist was spun onto the wafers (Shipley 1813), patterned with rectangular structures mimicking the gecko spatulae, and developed. The oxide layer was then opened by reactive ion etching with $CF_4$. The patterned oxide layer formed the bottom of the two-layer etch mask. The remaining photoresist was stripped off, and a new layer of Shipley 1818 was spun onto the wafers. This new layer was patterned with cylindrical structures mimicking the gecko setae and developed. The photoresist layer formed the top of the two-layer etch mask. Once the two-layer etch mask was in place, the hierarchical structure itself was formed using deep reactive ion etching. First, the wafer was etched to a depth of 60 microns. The photoresist was then stripped from the wafer, revealing the bottom layer (oxide) etch mask. The wafer was then etched an additional 20 microns to form the final structure.

Dry Adhesive Fabrication Scheme

Figure 2:
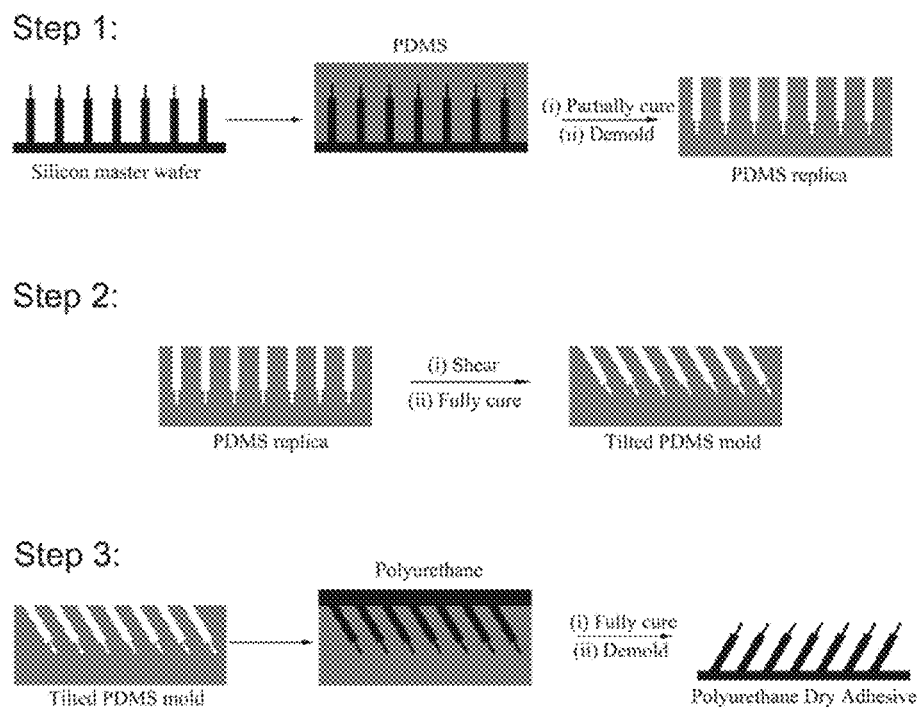
FIG. 2 shows a schematic illustration of the different steps involved in fabricating gecko-inspired adhesives of the present invention.

FIG. 2 shows a schematic of the different steps in the fabrication of a 2-level hierarchical polyurethane-based (ST-1060 BJB Enterprise, Inc., Tustin, Calif., USA) dry adhesive. In the first step, the silicon master wafer was used as a mold to create an inverse PDMS replica. Sylgard 184 PDMS (Dow Corning, Midland, Mich.) was mixed in a 10:1 (prepolymer to crosslinker) ratio. After removal of air bubbles formed during mixing, the viscous liquid was poured onto the silicon master and cross-linked at 75° C. for 40 min. The partially cured PDMS replica was then laterally sheared in a home-built shearing device by applying a predetermined shear distance to achieve the desired tilt angle(60°-90°. In using the home-built shearing device, the partially cured PDMS replica was placed in between upper and lower surfaces (i.e., glass slides). The normal load and alignment were controlled using 4 screws to bring the upper and lower surfaces together while the springs provide the resistance. A manual linear translational stage, which moved the lower surface, was used to apply the desired strain. After shearing, the PDMS replica was then fully cured in its sheared state at 75° C. for 24 hours resulting in the PDMS replica mold with tilted cylindrical holes and rectangular tips. Polyurethane was then poured onto the PDMS replica and allowed to cure at 75° C. for 72 hours. The final polyurethane-based dry adhesive was peeled off from the PDMS replica (which could be re-used to create additional samples).

Adhesion and Friction Measurements

Figure 3:
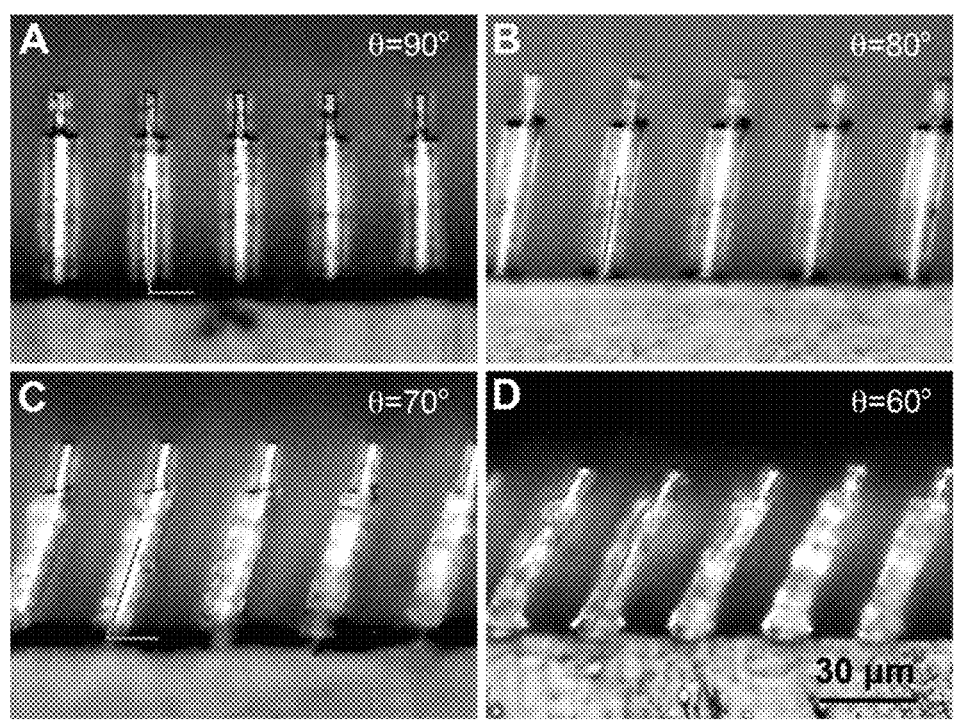
FIG. 3 shows SEM images of gecko-inspired adhesives of the present invention composed of polyurethane with pillars at (A) 90°, (B) 80°, (C) 70°, and (D) 60° tilt angles.

Adhesion and friction measurements were performed on a universal materials tester (CETR Enterprise, Inc., Campbell, Calif., USA). Specimens with tilted fibrillar arrays were fixed on a glass slide using double-sided tape. A curved borosilicate surface, used as the probe (radius of curvature=3 cm, Anchor Optics, Barrington, N.J.), attached to a force sensor (FL, CETR, Campbell, Calif.) with a cantilever (spring constant k=520 N/m), was then brought into contact with the bottom surface at a predetermined preload. During a typical experiment, the probe was brought into contact with the sample with a predetermined preload of 2 mN (contact area 0.78 $mm^2$). The probe was then dragged in gripping direction (or releasing direction) for 1mm at a velocity of 10 µm/s. After dragging, the probe was pulled off at 90° from the sample. Four samples with tilt angles θ ranging from 90° (no tilt) to 60° with 10° tilt increments (FIG. 3) were tested. Prior to each experiment, the probe was cleaned with ethanol and the samples were tested without further cleaning. A camera was used to digitally record a side view of the experiments and extract the dynamic (i.e., while shearing) tilt angles.

Design of Dry Adhesives

The adhesive pads of the well-studied Tokay gecko consist of hierarchical structures (a dense array of cylindrical setal shafts grouped in tetrads in a square lattice (~100 µm in length and ~5 µm in diameter, spaced ~18 µm apart) which split into hundreds of spatula shafts each bearing multiple spatula pads (~200 nm in width and 5-10 nm in thickness). Although the gecko pads consist of a relatively stiff material, β-keratin (~1-4 GPa modulus), the hierarchical structures provide compliance, which aids in maximizing the true contact area and adhesion to rough surfaces. In addition, the setal shafts are tilted by ~45°, which provides anisotropic tribological properties depending on the direction in which the adhesive surface is sheared.

Inspired by the Tokay gecko, we incorporated two hierarchical levels in our synthetic gecko structures. The first level consisted of an array of cylindrical pillars (60 µm in length, 20 µm in diameter), attached to a base, which provided an overall compliance to the dry adhesive mimicking the setal shaft. The second level was a thinner rectangular pad-like structure (20 µm in width, 7 µm in thickness) over each pillar, which provided the local compliance and maximized contact with other surfaces for adhesion. The cylindrical pillars were organized in a rectangular lattice (40 µm center-to-center distance in the tilt direction and 30 µm center-to-center distance along the other in-plane axis) to minimize contact with the neighboring pillars when tilted. Different tilt angles were incorporated into our structures to generate the anisotropic tribological properties upon shearing.

Characterization of Tribological Properties

Figure 4:
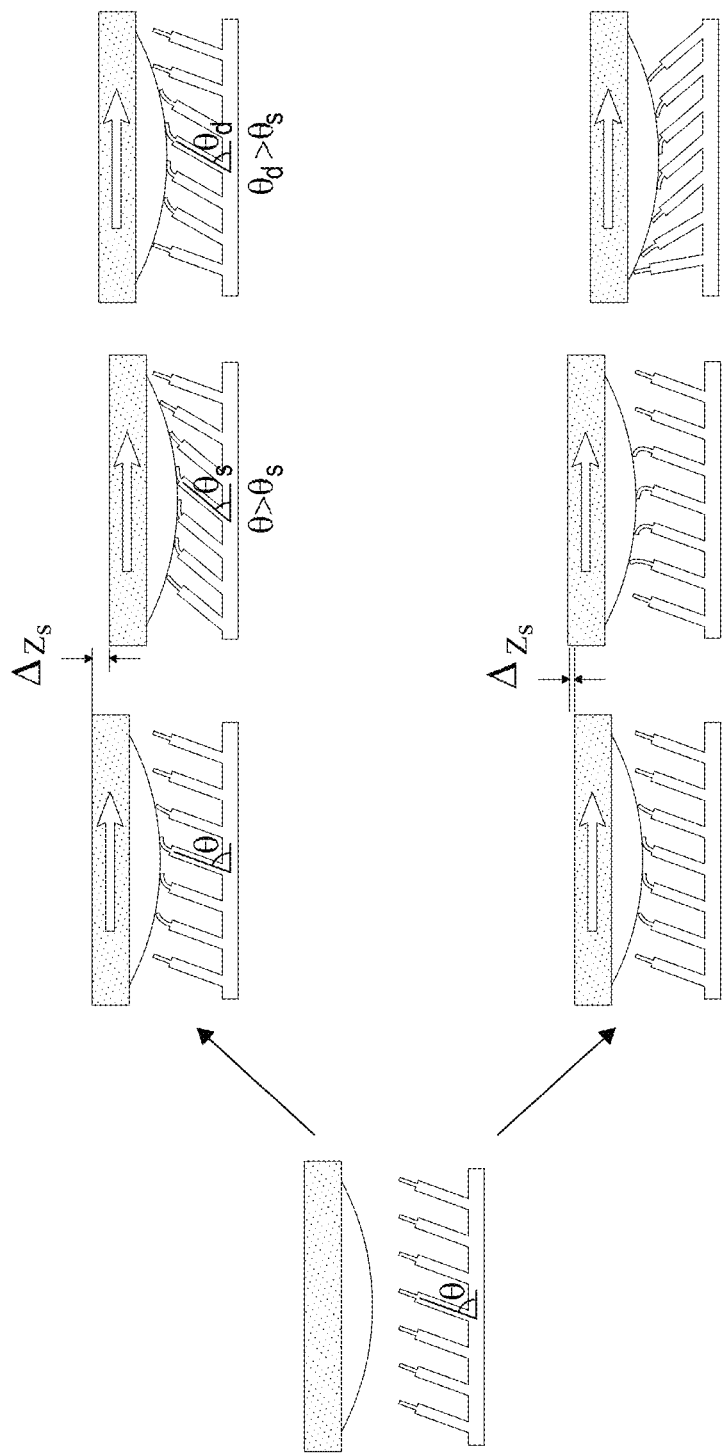
FIG. 4 shows a schematic illustration of the tribological measurements of gecko-inspired adhesives tests in the gripping and releasing direction.

FIG. 4 shows a schematic of the different stages encountered when shearing the tilted samples (with an initial pillar tilt angle θ) in the gripping (the top figures) and releasing (the bottom figures) directions. Each experiment began with applying a 2 mN preload (sufficient to deform the more compliant tips but not the cylindrical pillars to a large extent as determined optically). When shearing in the gripping direction, an initial period of static adhesion and friction (i.e., the thin pads remain adhered to the probe) was achieved during which the adhesion force caused the probe to move closer to the sample (by a distance $\Delta z_s$), and the pillar tilt angle decreased to $\theta_s$, from the initial tilt angle θ. At a critical shear force, the pads began to slide resulting in dynamic adhesion $F_{\perp,d}$ and friction forces $F_{\parallel,d}$, which were lower than their static counterparts, while the tilt angle increased slightly to $\theta_d$. By contrast, in the releasing direction, the sample initially exhibited an intermediate stage in which the pads change their orientation, resulting in a repulsive (i.e., negative adhesion) force pushing the probe by a distance $\Delta z_i$. Continued shearing past the intermediate stage resulted in the cylindrical pillars and pads re-orienting themselves to the releasing direction while still providing dynamic adhesion and friction forces.

Figure 5A:
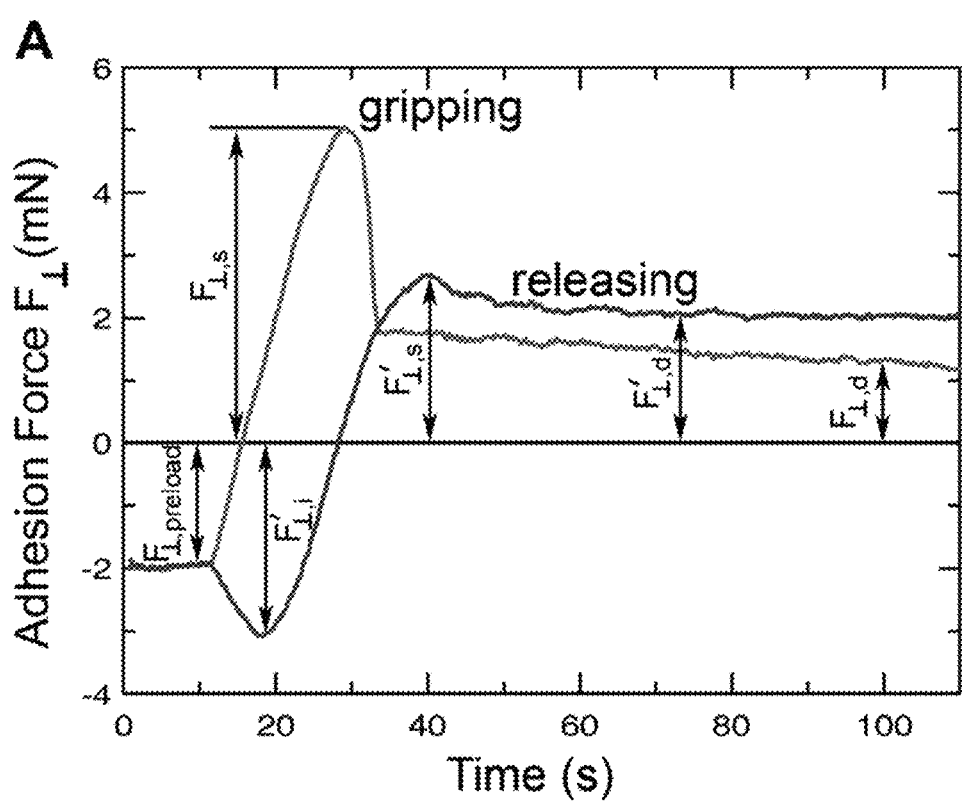
FIG. 5A shows a graph of the dynamic measurements of the adhesion forces generated by a gecko-inspired adhesive sample with 70° tilt when sheared in the gripping and releasing direction.
Figure 5B:
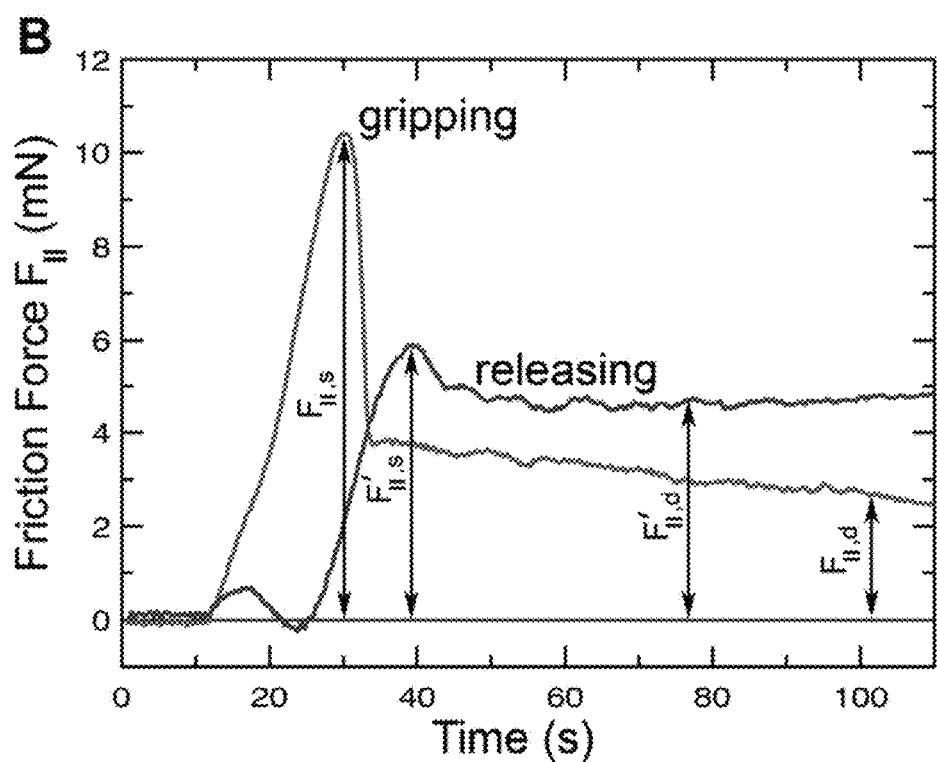
FIG. 5B shows a graph of the dynamic measurements of the friction forces generated by a gecko-inspired adhesive sample with 70° tilt when sheared in the gripping and releasing direction.

The different stages involved in the adhesion and friction forces in the gripping and releasing direction were apparent in the tribological data. FIG. 5A shows the adhesion force as a result of shearing a polyurethane-based dry adhesive with cylindrical pillars tilted at 70° (FIG. 3C). In the gripping direction, a maximum static adhesion force $F_{\perp,s}$ of ~5 mN was obtained and the dynamic adhesion force $F_{\perp,d}$ dropped to ~2 mN during sliding. In the releasing direction, the adhesion force $F'_{\perp,i}$ initially dropped ~-3 mN (i.e., repulsive force) before increasing to a steady dynamic adhesion $F'_{\perp,d}$ of ~2 mN. FIG. 5B shows the corresponding friction forces from the same surface. Before sliding began, the static friction $F_{\|,s}$ force in the gripping direction was ~10 mN compared to $F'_{\|,s}$ ~6 mN in the releasing direction. The drag velocity was 10 μm/s. Therefore, the dry adhesive provides a strong adhesion and friction (before sliding) when sheared in the gripping direction, and provides an initial intermediate repulsive force and low friction (before the static regime).

Figure 6:
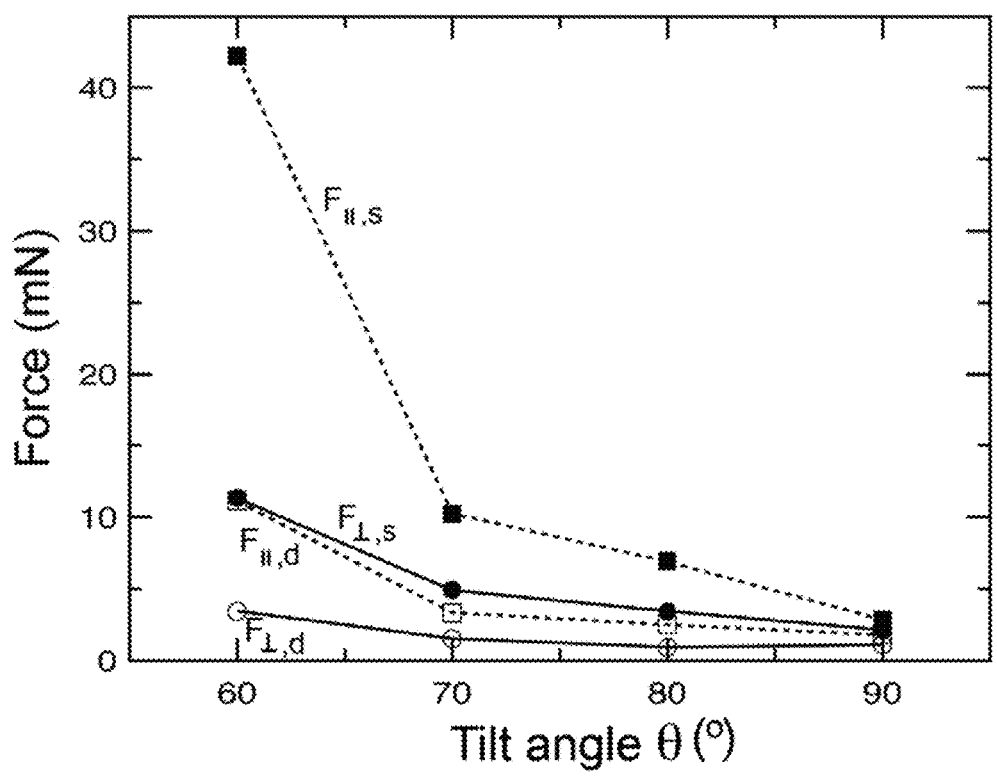
FIG. 6 shows a graph of the static and dynamic adhesion and friction forces generated by the gecko-inspired adhesives of the present invention with different tilt angles.

The adhesion and friction forces (both static and dynamic) in the gripping direction as a function of the tilt angle are summarized in FIG. 6. Both the adhesion and friction forces showed an increase as the tilt angle was decreased with the 60° tilt sample showing a larger increase in forces compared to the other samples. In all cases, the static forces were larger than the dynamic forces.

Comparison of Gecko-inspired Adhesive to Gecko Setal Array

Figure 7:
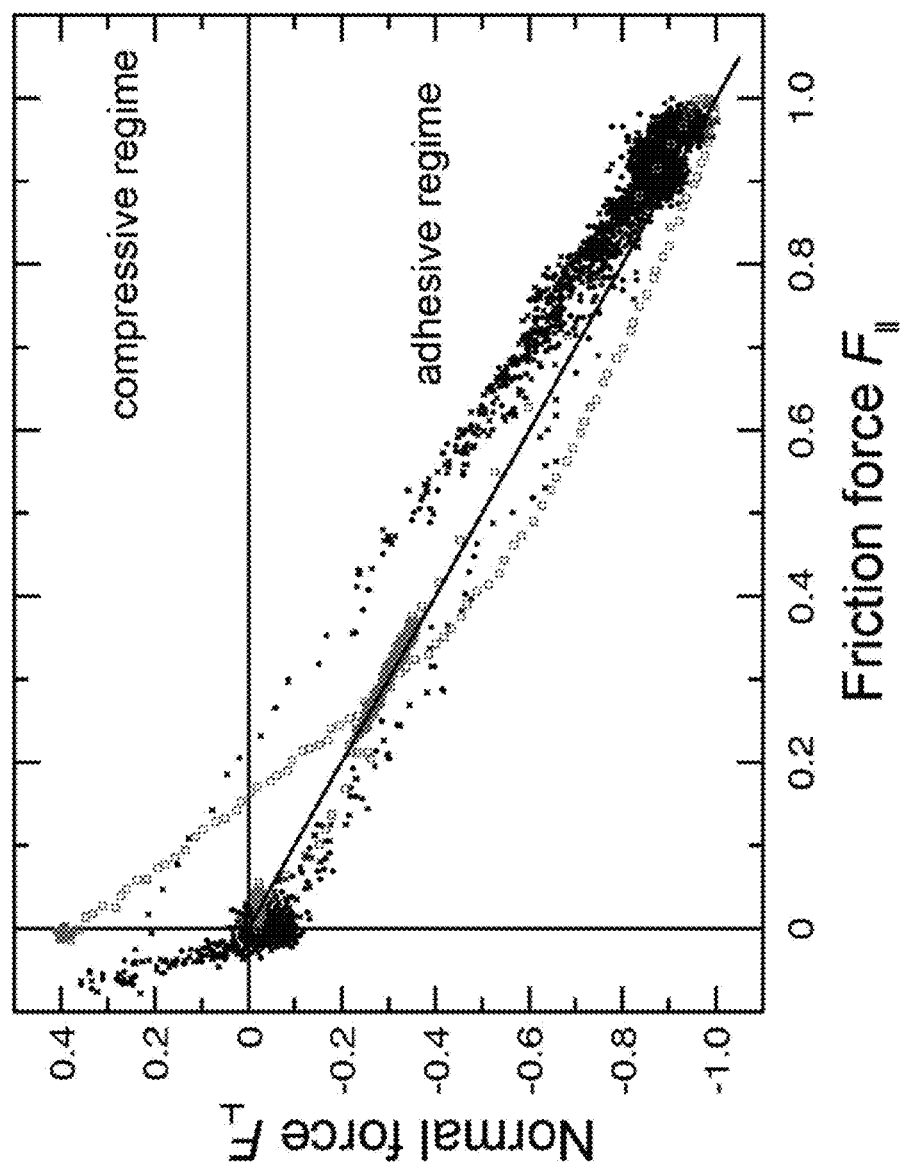
FIG. 7 shows a normalized normal force vs. friction force plot for a Tokay gecko setal array (black dots) and for a gecko-inspired adhesive of the present invention with 70° tilt (grey open dots) wherein the forces are normalized to their maximum respective magnitudes.

The adhesion and friction forces generated by the 70° tilt sample were compared to the tribological properties of a Tokay gecko setal array when sheared in the gripping direction (FIG. 7). The forces were normalized to their corresponding maximum magnitudes to facilitate the comparison. We find a remarkable similarity in the tribological properties of the gecko-inspired adhesive of the present invention to a Tokay gecko setal array. The solid line (having a slope of −2 in dimensional form) is consistent with the frictional adhesion model proposed by Autumn et al. for shearing in the adhesive or gripping direction, which predicts the magnitude of the ratio of the friction force to the adhesion force ought to be greater than) −1/tan(30°)=−1.7 (based on a detachment angle of 30° for the Tokay gecko). The fact that the tribological properties of our gecko-inspired adhesives (grey open dots) follow predictions of the frictional adhesion model allows for potential fine control of the adhesion strength generated through tuning of the friction forces.

A key difference in the gecko-inspired adhesive of the present invention compared to a gecko setal array is the single stick-slip event which occurs in our samples but absent in the case of the gecko setal array. We attribute this phenomenon to the fact that a gecko setal array consists of millions of individual contact points, as opposed to the relatively fewer contact points in our samples (estimated number of contacts ~650 for our experimental technique). In the case of a gecko setal array, the resulting adhesion and friction forces obtained during shearing originate from the temporal fraction of the millions of spatula that are adhered to the surface.

Anisotropic Tribological Properties of Gecko-inspired Adhesive

Figure 8:
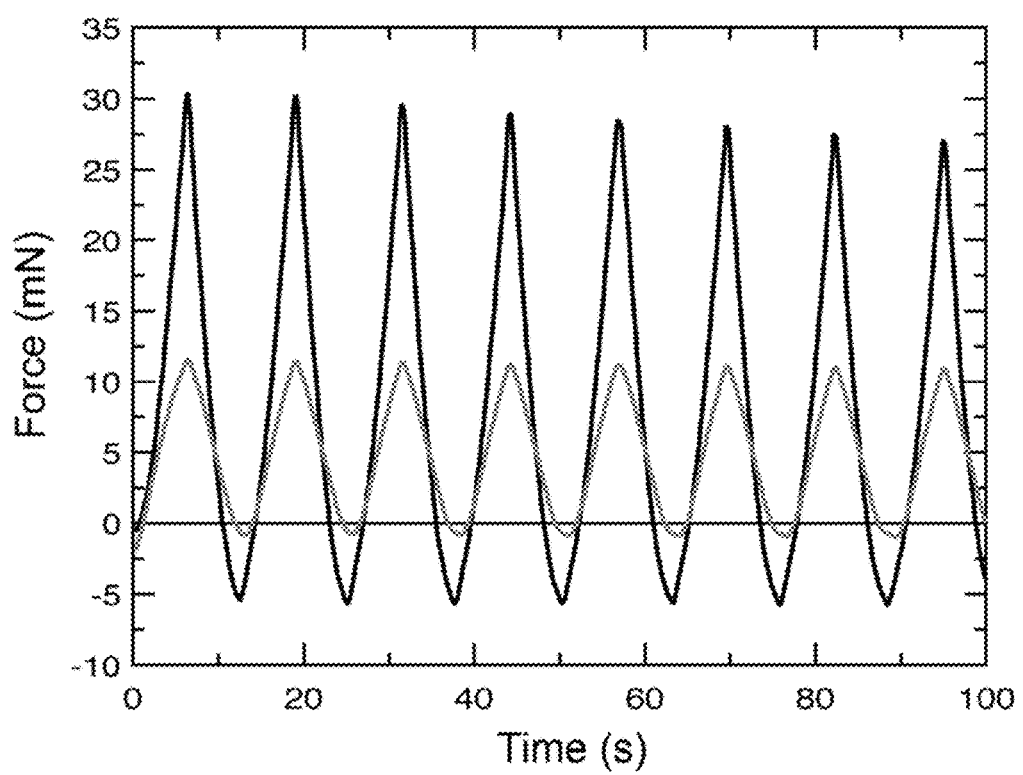
FIG. 8 shows the static adhesion (grey curve) and friction forces (black curve) generated by a gecko-inspired adhesive of the present invention during eight cycles, each consisting of shearing in the gripping direction followed by the releasing direction.

FIG. 8 shows the adhesion and friction force generated by the gecko-inspired adhesive of the present invention during eight shearing cycles. Each cycle consisted of actuating the sample in the gripping direction until maximum static adhesion and friction was achieved (i.e., static adhesion regime) followed by actuating the sample in the releasing direction until the adhesion force was repulsive. The gradual decrease in the friction force generated in the gripping direction is attributed to material transfer (i.e. polyurethane) from the gecko-inspired adhesive to the glass probe with repeated use. We found that if the probe was cleaned with ethanol, we recovered maximum adhesion and friction forces. The adhesion force does not change significantly over the eight cycles.

Comparison to Peel Zone Model

The adhesion data generated from the samples with different tilt angles was compared to the Peel Zone model, which was developed to model the adhesion force of pressure sensitive tapes as a function of the applied pulling force. Applying the Peel Zone model, $$\frac{F_{\perp,s}}{b} = \frac{2\gamma\theta_s}{\pi(1-\cos\theta_s)},$$

where $F_{\perp,s}$ is the static adhesion force, b is the total width of the peeling elements, γ is the adhesion energy, and $\theta_s$ is the static peel angle, to our system, the model predicts that the adhesion force $F_{\perp,s}$ ought to increase as the peel angle is decreased. In our case, the peel angle is equivalent to the static tilt angle $\theta_s$, (refer to FIG. 4) of the cylindrical pillars and pads during the static adhesion regime of our measurements in the gripping direction. A camera was used to capture the side view of the samples while performing the tribological experiments and to extract the static tilt angle (FIG. 9) for each sample. For example, the tilt angle of the initial 70° tilt sample reduced from θ=70° to $\theta_s$=29° at the point of maximum static adhesion force $F_{\perp,s}$ (peak in adhesion force in FIG. 5A) during the static regime of the adhesion measurement.

Figure 10:
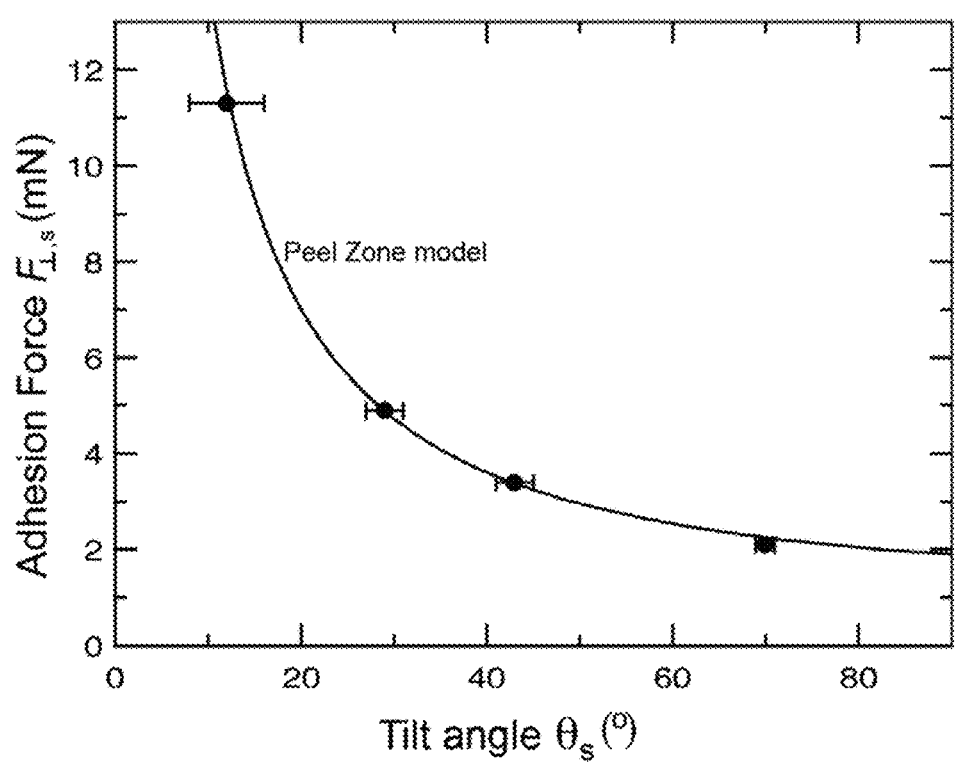
FIG. 10 shows a graph of the static adhesion force generated by gecko-inspired adhesives of the present invention as a function of the static tilt angle $\theta_s$ wherein the solid line is a fit of the Peel Zone model.

FIG. 10 shows a fit of the Peel Zone model to our data after accounting for the change in the tilt angle during the static regime of the adhesion force measurement. A good agreement was found between our data and the Peel Zone model inferring that our dry adhesive adheres to surfaces through a similar mechanism to adhesives tapes except that in our case, the adhesion energy is a result of van der Waals forces as opposed to tacky filaments found in adhesive tapes.

A novel, easy and scalable fabrication scheme is disclosed to incorporate tilt into polymer-based dry adhesives. A series of dry adhesives with different tilt angles was fabricated and the adhesion and friction forces were characterized using a universal materials tester. The samples with tilt angles θ<90° showed anisotropic adhesion and friction data with the magnitude of the static adhesion and friction forces increasing as the tilt angle was decreased. The ratio of the friction force to the adhesion force of our samples when actuated in the gripping direction was in agreement with the frictional adhesion model and similar to the value obtained when shearing setal arrays of the Tokay gecko in the gripping direction. The static adhesion data also showed good agreement to the Peel Zone model for tape peeling after accounting for the decrease in the tilt angle of the structures during the static regime of the measurement.

EXAMPLE 2

In an alternative embodiment, the polyurethane-based gecko-inspired structures consist of 2 levels of hierarchy (see FIG. 11A); a triangular prism pillar (approximately 30 μm×25 μm×25 μm, and 80 μm high) terminated by a rectangular pad-like structure (approximately 20 μm×20 μm×7 μm), arranged in a rectangular lattice (approximately 30 μm center-to-center in the tilt (x-axis) direction, and 37 μm center-to-center along the in-plane or y-axis axis).

Fabrication of Patterned Silicon Mold

Silicon master wafers were fabricated using standard microfabrication techniques. Briefly, 4 inch silicon wafers (test grade, University Wafers) were cleaned in an oxygen plasma, after which a 600 nm oxide layer was grown using plasma-enhanced chemical vapor deposition. Next, positive photoresist was spun onto the wafers (Shipley 1813), patterned with rectangular structures mimicking the gecko spatulae, and developed. The oxide layer was then opened by reactive ion etching with $CF_4$. The patterned oxide layer formed the bottom of the two-layer etch mask. The remaining photoresist was stripped off, and a new layer of Shipley 1818 was spun onto the wafers. This new layer was patterned with triangular structures mimicking the gecko setae and developed. The photoresist layer formed the top of the two-layer etch mask. Once the two-layer etch mask was in place, the hierarchical structure itself was formed using deep reactive ion etching. First, the wafer was etched to a depth of 60 µm. The photoresist was then stripped from the wafer, revealing the bottom layer (oxide) etch mask. The wafer was then etched an additional 20 µm to form the final structure.

Dry Adhesive Fabrication Scheme.

Two-level hierarchical polyurethane (PU) based (ST-1060 BJB Enterprise, Inc., Tustin, Calif.) dry adhesives were fabricated in a multi-step process. Briefly, in the first step, the silicon master wafer was used as a mold to create an inverse polydimethylsiloxane (PDMS) replica. To facilitate the peeling of the PDMS inverse mold from the silicon master, the latter was pretreated with a self-assembled monolayer of octadecyltrichlorosilane (OTS) coating. Sylgard 184 PDMS (Dow Corning, Midland, Mich.) was mixed in a 10:1 (pre-polymer/cross-linker) ratio. After removal of air bubbles formed during mixing, the viscous liquid was poured onto the silicon master and cross-linked at 75° C. for 40 min. As an optional step, the partially cured PDMS replica was then laterally sheared in a home-built shearing device by applying a predetermined shear distance to achieve the desired tilt angle (ranging from) 60°-90°. The PDMS replica was then fully cured at 75° C. for 24 hour, resulting in the PDMS replica mold with triangular holes and rectangular tips. PU was then poured onto the PDMS replica and allowed to cure at 75° C. for 72 hours. The final PU-based dry adhesive was peeled off from the PDMS replica.

Adhesion and Friction Measurements

Adhesion and friction measurements were performed on a universal materials tester (CETR Enterprise, Inc., Campbell, Calif.). A flat 2 cm×2 cm borosilicate glass surface, used as the probe, attached to a force sensor (DFM, CETR Enterprise, Inc., Campbell, Calif.) with a cantilever (spring constant k=4113 N/m), was then brought into contact with the gecko-inspired surface at a predetermined preload. During a typical experiment, the probe was brought into contact with the sample with a preload of 50 mN. The probe was dragged in the gripping direction at a velocity of 10 µm/s after which it was pulled off at 90° from the sample at the same speed. For the detachment experiments, after shearing in the gripping direction (to activate the adhesion), the probe was then dragged in the opposite (releasing) direction and pulled off at 90° from the sample. Samples with tilt angles θ of 90° (i.e., no tilt) and 63° were tested to study the influence of the tilt angle. Prior to each experiment, the probe was cleaned with ethanol while the samples were tested without pre-cleaning. A camera was used to digitally record a side view of the experiments, which provided the dynamic (i.e., while shearing) tilt angles.

Design of Dry Adhesives

Figure 11A:
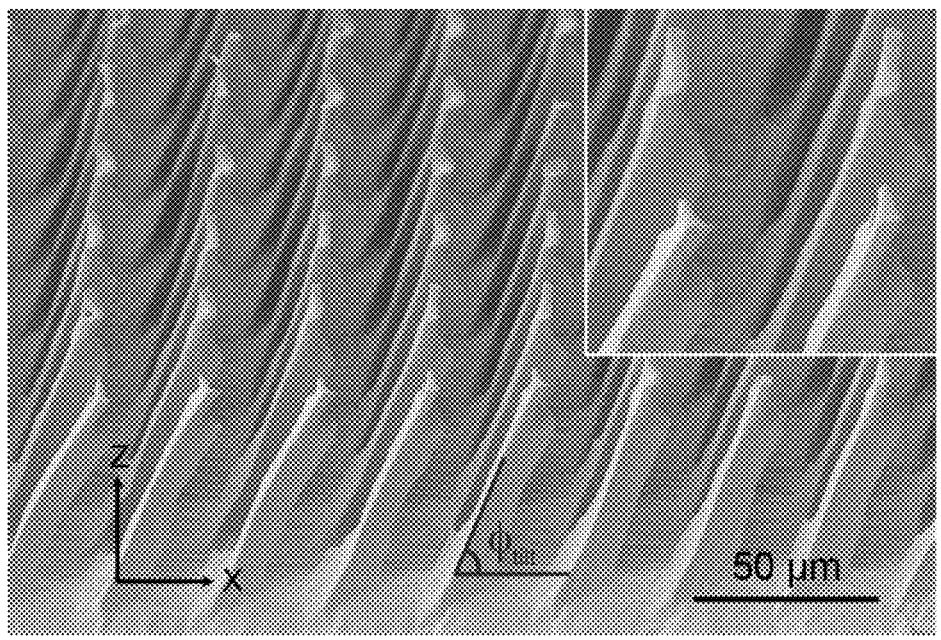
FIG. 11A shows a SEM image of an alternative embodiment of gecko-inspired adhesives of the present invention consisting of a first level of triangular prism pillars and a second level of thinner rectangular pad-like structures (i.e., adhesive pads) biased towards one of the flat edges wherein the inset showing a magnified view of the terminal end of the prismatic pillars.
Figure 11B:
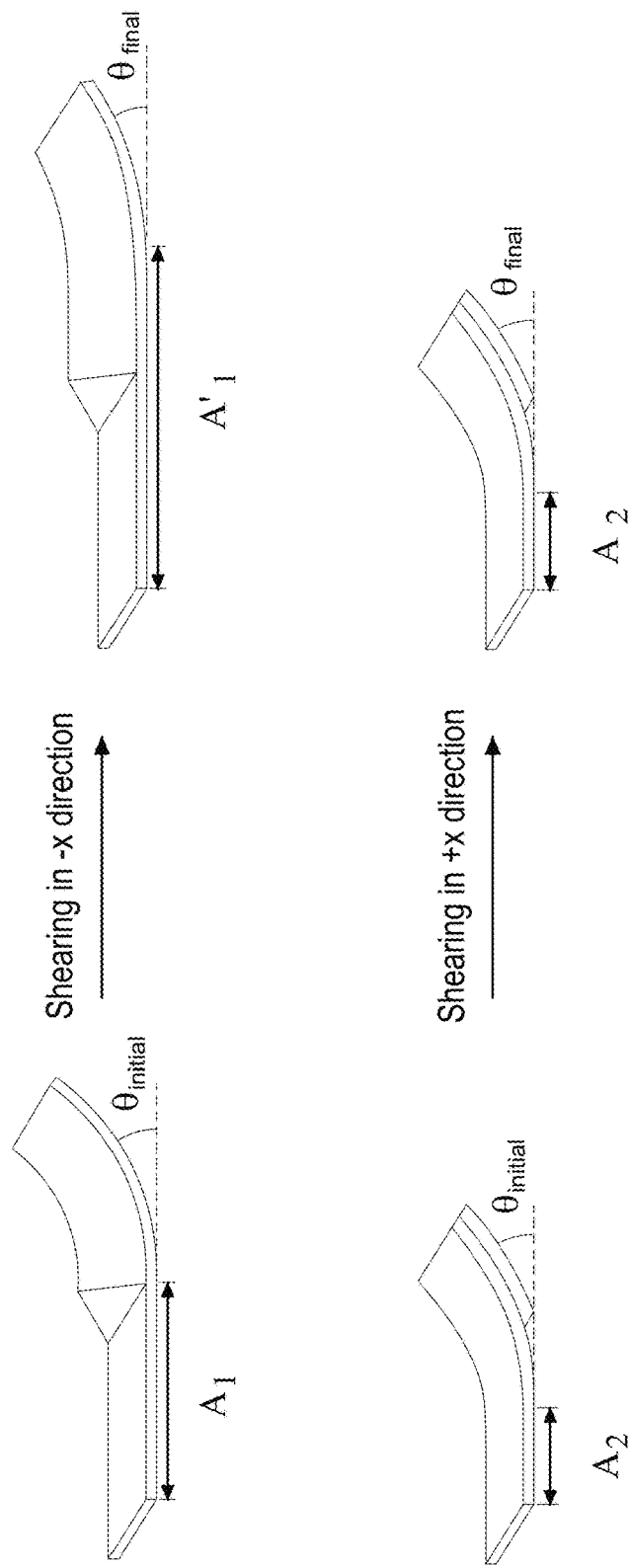
FIG. 11B shows a drawing of an alternative embodiment of gecko-inspired adhesives of the present invention consisting of a triangular prism pillar and a thinner rectangular pad-like structure (i.e., adhesive pads) biased towards one of the flat edges of the triangular prism pillar.

The triangular prism pillar design, as shown in FIGS. 11A and 11B, was introduced to minimize attractive interactions between neighboring pillars when or if the pillars came into contact (i.e., creating a line contact). This allows for a higher number of pillars to be patterned per unit area. As shown in FIG. 11B, the thinner rectangular pad-like structure was purposely biased towards the longer edge of the triangle, which provides a large contact area when the structure is sheared in the gripping direction. In the gripping direction (shown in the top of FIG. 11B), the large initial contact area $A_1$ leads to large friction (since the friction is adhesion-controlled at the low loads), pinning the fiber, further increasing the contact area to $A'_1$ and creating a small peel angle ($\theta_1$, final) in the bifurcation region. Based on the peel-zone model for tape peeling, small peel angles are required for high adhesion forces. Therefore, when the microstructured surface is sheared in the gripping direction, high friction and adhesion forces are generated.

However, when sheared in the opposite (or "releasing" direction, as shown in the bottom of FIG. 11B), the apex of the triangular prism prevents full contact of the rectangular pad leading to a smaller initial contact area $A_2$. The small contact area leads to lower friction and since the structure is unable to tilt further (due to the apex of the triangle preventing further contact), the tilt angles remain the same, i.e., $\theta_{1,initial}=\theta_{2,final}$. Therefore, when the microstructured surface is sheared in the releasing direction, lower friction and adhesion forces are generated.

Figure 12:
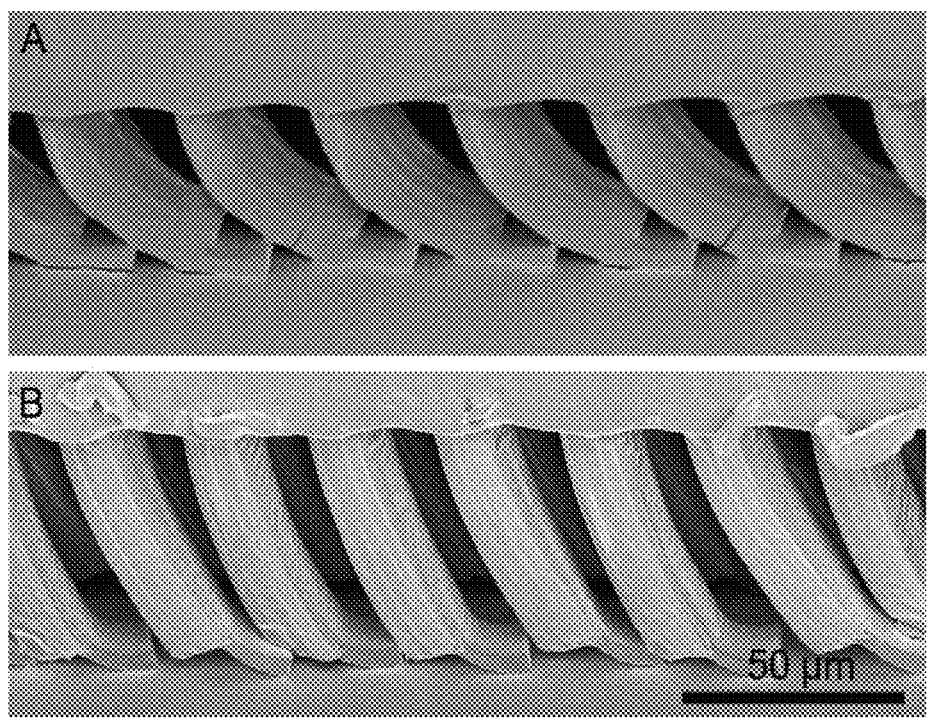
FIG. 12 shows (A) a side view SEM image of an alternative embodiment of the gecko-inspired adhesive of the present invention under shear in the gripping direction, and (B) a side view SEM image of an alternative embodiment of the gecko-inspired adhesive of the present invention under shear in the releasing direction.

The SEM images of FIG. 12 further illustrates the gripping (FIG. 12A) and shearing (FIG. 12B) of this embodiment. In the gripping direction, a large contact area is formed between the gecko-inspired structures and the opposing surface. In addition, the apex of the triangular prism prevents further contact between neighboring pillars thus minimizing their interactions. The latter is essential to allow the pillars to elastically regain their original configuration when the pillars are unloaded. If the interactions between neighboring pillars overcome the stored elastic energy (within the pillars) under load, self-matting (i.e., pillars remain stuck with each other) occurs, which is undesirable. In the releasing direction, the apex of the triangular prism now serves to prevent the rectangular pad from forming a good contact with the opposing surface.

Characterization of Tribological Properties

Figure 13A:
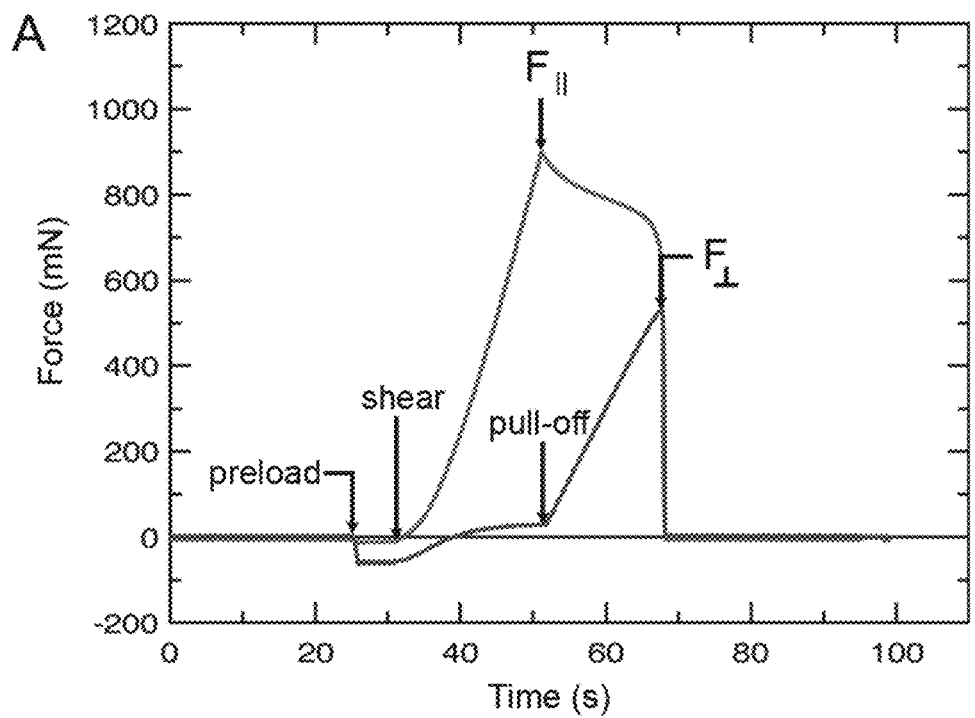
FIG. 13A shows a plot of the adhesion and friction forces generated by an alternative embodiment of the gecko-inspired adhesive of the present invention against a flat borosilicate surface during a typical measurement in the gripping direction.

The tribological properties of a gecko-inspired adhesive surface (area=32 $mm^2$) consisting of pillars with tilt angle $\theta_{tilt}=63°$ (i.e., tilt angle in the unloaded state) sheared in the gripping direction are shown in FIG. 13A. In a typical experiment, a preload of 50 mN was applied onto the surface for 5 seconds followed by shearing of the opposing surface (flat borosilicate glass wafer as the probe). The shearing and pull-off velocities were both 10 µm/s. Upon shearing, the normal load $F_{\perp,shear}$ entered the adhesive regime, and the friction force $F_{\parallel,gripping}$ increased. The probe was then retracted perpendicularly until it detached, which provided the pull off force $F_{\perp,pull\ off}$ ~500 mN. The relatively large ratio of the adhesion force to applied preload of 10 (i.e., 500 mN/50 mN) is particular attractive in climbing robots, in which low preloads (thus resulting in low corresponding reaction forces) allow for more stable locomotion of vertical and inverted surfaces. Data for the maximum adhesion $F_{\perp,pull\ off}$ and the maximum friction forces $F_{\parallel,gripping}$ before detachment were recorded for 30 cycles (FIG. 13B) for 2 different samples; one with tilt angle $\theta_{tilt}=63°$ and another with no tilt (i.e., $\theta_{tilt}=90°$). The results show the influence of the tilt angle $\theta_{tilt}$ on the adhesion and friction forces, and also demonstrate the reusability of the gecko-inspired adhesive structure.

Figure 14A:
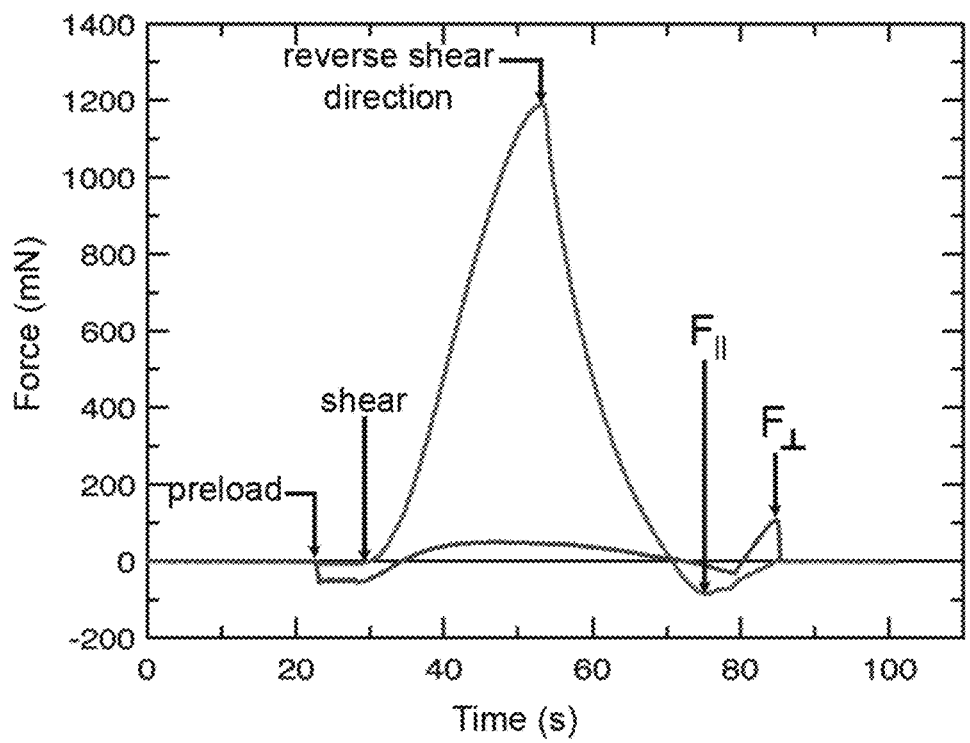
FIG. 14A shows a plot of the adhesion and friction forces generated by an alternative embodiment of the gecko-inspired adhesive of the present invention against a flat borosilicate surface in one cycle involving a shearing step in the gripping direction to activate the adhesion followed by a shearing step in the releasing direction.
Figure 14B:
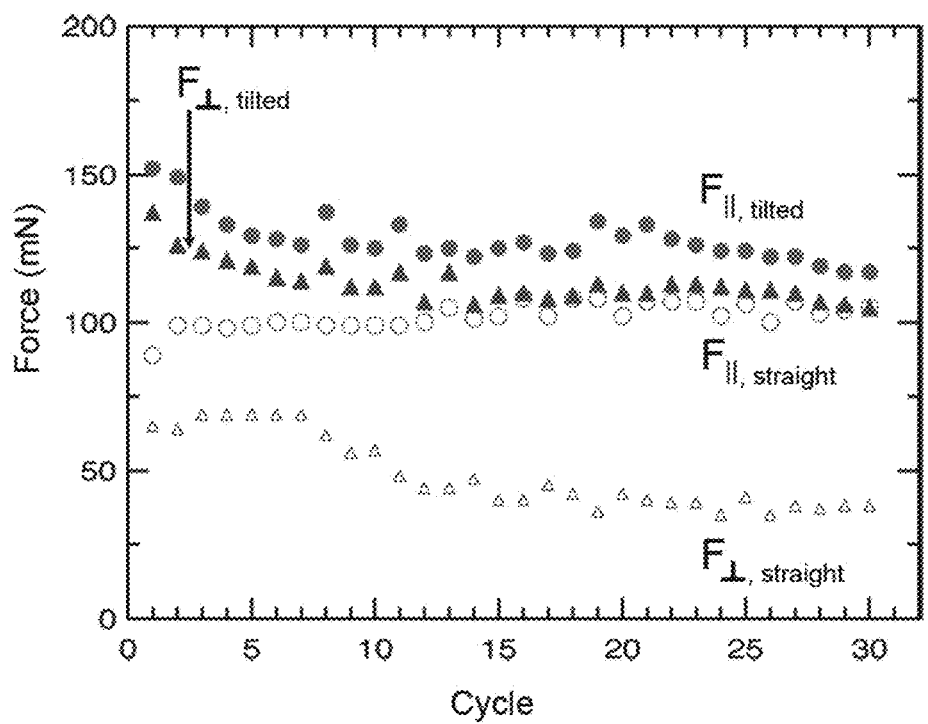
FIG. 14B shows a plot of the friction and pull-off force over 30 cycles using an alternative embodiment of the gecko-inspired adhesive of the present invention with no tilt (unfilled data points) and with tilt (bold data points).

Similarly, the tribological properties of the gecko-inspired adhesive surface (area=32 $mm^2$) were measured when first sheared in the gripping direction, followed by shearing in the releasing direction, and finally pulling off to simulate the detachment process, as shown in FIG. 14A. The maximum adhesion force $F_{\perp,pull\ off}$ in the releasing direction was lower compared to the maximum adhesion force $F_{\perp,pull\ off}$ in the gripping direction. The magnitude of the friction force in releasing direction $F_{\|,releasing}$ was also found to be considerably lower compared to $F_{\|,gripping}$ (c.f., 0.9 N of friction force in the gripping direction versus 0.13 N in the releasing direction). Data for maximum $F_{\perp,pull\ off}$ and the maximum $F_{\|,releasing}$ before detachment were recorded for 30 cycles (FIG. 14B) for 2 different samples; one with tilt angle $\theta_{tilt}$=63° and another with no tilt (i.e., $\theta_{tilt}$=90°). The results show the influence of the tilt angle 01111 on the adhesion and friction forces, and also demonstrate the reusability of the gecko-inspired adhesive structure. These results show the geometrical design of the pillars provides high adhesion and friction when actuated in the gripping direction, yet provides lower adhesion and friction when actuated in the releasing direction for detachment.

Comparison to Peel Zone Model

Figure 13B:
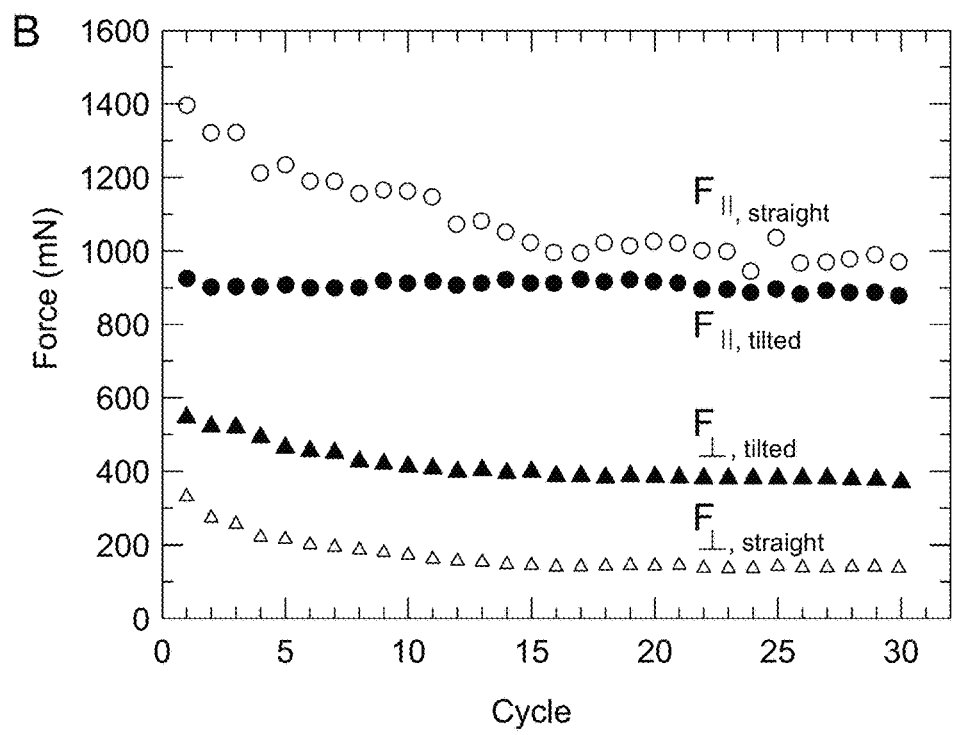
FIG. 13B shows a plot of the maximum friction and maximum pull-off force over 30 cycles using an alternative embodiment of the gecko-inspired adhesive of the present invention with no tilt (unfilled data points) and with tilt (bold data points).

According to the peel zone model for tape peeling, smaller peel angles θ between the adhesive pads and the opposing surface lead to larger adhesion and friction forces because of the larger interaction area in the bifurcation region of peeling surfaces. Our data was consistent with the peel zone model; pillars that had no tilt (i.e., $\theta_{tilt}$=90°) produced smaller adhesion forces compared to the pillars with tilt. We also found that the maximum friction force was larger for the pillars with tilt compared to those without tilt, again consistent with the peel zone model. The lower friction forces recorded for the pillars with tilt in FIG. 13B is because in these experiments, the surfaces were sheared only to the point to obtain the maximum pull-off force (which did not coincide with a maximum friction force). We also found a monotonic decrease in the forces (both adhesion and friction) within the first 15 cycles. We attribute this decrease to material (i.e., polymer) transfer from the gecko-inspired adhesive to the probe. In these experiments the preload was 50mN, and the shearing and pull off velocities were both 10 μm/s.

What is claimed is:

1. An adhesive comprising:
    a base;
    a pillar wherein said pillar is in a shape of a triangular prism and wherein said pillar has a first end and a second end, wherein said first end is attached to said base; and
    a pad-like structure, wherein said pad-like structure is attached to said second end;
    wherein a first face of said triangular-prism shaped pillar is about 30 μm wide, a second face of said triangular-prism shaped pillar is about 25 μm wide, and a third face of said triangular-prism shaped pillar is about 25 μm wide, and wherein said triangular-prism shaped pillar is about 80 μm in height.

2. The adhesive of claim 1, wherein said pad-like structure is rectangular in shape.

3. The adhesive of claim 2, wherein said pad-like structure is about 20 μm in width and 7 μm in thickness.

4. The adhesive of claim 1 wherein said triangular-prism shaped pillar is tilted at an angle of about 60°-90° ; and
    wherein a first face of said triangular-prism shaped pillar is about 30 μm wide, a second face of said triangular-prism shaped pillar is about 25 μm wide, and a third face of said triangular-prism shaped pillar is about 25 μm wide, and wherein said triangular-prism shaped pillar is about 80 μm in height.

5. The adhesive of claim 4, wherein said pad-like structure is rectangular in shape.

6. The adhesive of claim 5, wherein said pad-like structure is about 20 μm in width and 7 μm in thickness.

7. The adhesive of claim 3, wherein said pillar is one of a plurality of pillars, and wherein said plurality of pillars are arranged in a rectangular lattice.

8. The adhesive of claim 7, wherein said rectangular lattice has a center-to-center distance in a first direction of about 40 μm and a center-to-center distance along a second direction of about 30 μm.

9. The adhesive of claim 6, wherein said pillar is one of a plurality of pillars, and wherein said plurality of pillars are arranged in a rectangular lattice.

10. The adhesive of claim 9, wherein said rectangular lattice has a center-to-center distance in a first direction of about 40 μm and a center-to-center distance along a second direction of about 30 μm.

* * * * *